United States Patent
Choi et al.

(10) Patent No.: US 10,528,162 B2
(45) Date of Patent: Jan. 7, 2020

(54) DISPLAY DEVICE INTEGRATED WITH SENSOR

(71) Applicant: Samsung Display Co., Ltd., Yongin-si (KR)

(72) Inventors: Bo-Kyung Choi, Yongin (KR); Jong-Moo Huh, Yongin (KR); Sung-Ho Kim, Yongin (KR); Min-Chul Shin, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/833,575

(22) Filed: Aug. 24, 2015

(65) Prior Publication Data
US 2016/0124556 A1 May 5, 2016

(30) Foreign Application Priority Data
Nov. 4, 2014 (KR) .................. 10-2014-0152356

(51) Int. Cl.
*G06F 3/041* (2006.01)
*H01L 27/32* (2006.01)
*G02F 1/1333* (2006.01)

(52) U.S. Cl.
CPC ........ *G06F 3/0412* (2013.01); *G02F 1/13338* (2013.01); *G06F 2203/04103* (2013.01); *H01L 27/323* (2013.01)

(58) Field of Classification Search
None
See application file for complete search history.

(56) References Cited

U.S. PATENT DOCUMENTS

| 2009/0134782 A1* | 5/2009 | Kim .................... H01L 27/3276 313/504 |
| 2009/0201267 A1* | 8/2009 | Akimoto ................. G06F 3/041 345/173 |
| 2011/0012140 A1* | 1/2011 | Grabowski ............. G09F 13/22 257/88 |
| 2011/0141042 A1 | 6/2011 | Kim et al. |
| 2011/0316802 A1 | 12/2011 | Choi |
| 2012/0105339 A1 | 5/2012 | Jung |
| 2012/0105342 A1* | 5/2012 | Yu .......................... G06F 3/0412 345/173 |
| 2014/0204285 A1* | 7/2014 | Jang ....................... G06F 3/044 349/12 |

FOREIGN PATENT DOCUMENTS

| KR | 10-2012-0000133 | 1/2012 |
| KR | 10-2012-0037610 | 4/2012 |
| KR | 10-2012-0045291 | 5/2012 |
| KR | 10-1309862 | 9/2013 |

* cited by examiner

*Primary Examiner* — Ifedayo B Iluyomade
(74) *Attorney, Agent, or Firm* — H.C. Park & Associates, PLC

(57) ABSTRACT

A display device integrated with a sensor includes a first substrate and a second substrate disposed while facing each other, and having exposed ends at different sides thereof, a sealing material configured to seal an overlapping region between the first and second substrates, a display unit including a plurality of pixels provided in a sealed region inside the sealing material, a sensor electrode unit formed on the second substrate, a first pad unit formed in an exposed part of the first substrate, and a second pad unit formed in an exposed part of the second substrate.

9 Claims, 4 Drawing Sheets

DISPLAY DEVICE INTEGRATED WITH SENSOR

CROSS REFERENCE TO RELATED APPLICATION

This application claims priority from and the benefit of Korean Patent Application No. 10-2014-0152356, filed on Nov. 4, 2014, which is hereby incorporated by reference for all purposes as if fully set forth herein.

BACKGROUND

Field

The present invention relates to a display device integrated with a sensor.

Discussion of the Background

Recently, various sensors have been integrated into display panels. For example, a display device has been developed that integrates a sensor. A display panel having an integrated sensor may be thin, and may be adapted to varied applications. A representative example of the display device integrated with a sensor may include a sensor electrode unit including touch electrodes directly formed on an upper substrate of a display panel.

SUMMARY OF THE INVENTION

Exemplary embodiments of the present invention provide a display device integrated with a sensor, including a sensor electrode unit disposed on an upper substrate directly connected to a driving element through a pad unit disposed on the upper substrate.

Additional features of the invention will be set forth in the description which follows, and in part will be apparent from the description, or may be learned by practice of the invention.

An exemplary embodiment of the present invention discloses a display device integrated with a sensor, including a first substrate and a second substrate disposed while facing each other and having exposed ends at different sides thereof, a sealing material configured to seal an overlapping region between the first and second substrates, a display unit including a plurality of pixels provided in a sealed region inside the sealing material, a sensor electrode unit formed on the second substrate, a first pad unit formed in an exposed part of the first substrate, and a second pad unit formed in an exposed part of the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
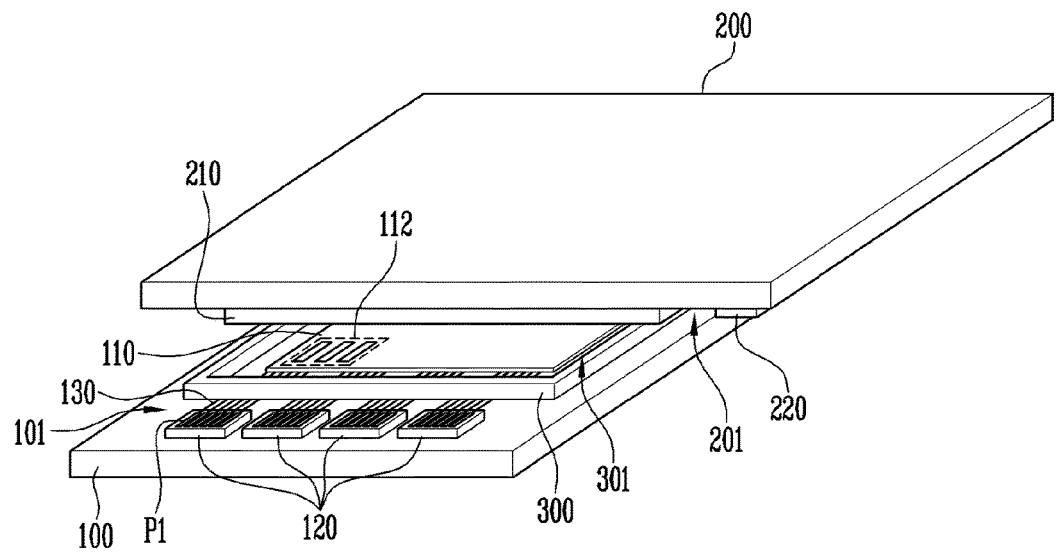
FIG. 1 is a perspective view of a display device integrated with a sensor according to an exemplary embodiment of the present invention.

The present invention may have various modifications and exemplary embodiments and thus specific exemplary embodiments will be illustrated in the drawings and described. However, it is not intended to limit the present invention to the specific embodiments, and it will be appreciated that the present invention includes all modifications, equivalences, or substitutions included in the spirit and the technical scope of the present invention.

In the description of respective drawings, similar reference numerals designate similar elements. In the drawings, sizes of the structures are exaggerated for accuracy. Terminologies such as first or second may be used to describe various components but the components are not limited by the above terminologies. The terms are used only to discriminate one constituent element from another constituent element. For example, without departing from the scope of the invention, a first constituent element may be named as a second constituent element, and similarly a second constituent element may be named as a first constituent element. Singular expressions used herein include plurals expressions unless they have definitely opposite meanings.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other specific characteristics, numbers, steps, operations, constituent elements, and components, or a combination thereof in advance. It will be understood that when an element such as a layer, film, region, or substrate is referred to as being "beneath" another element, it can be directly beneath the other element or intervening elements may also be present. It will be understood that when an element such as a layer, film, region, or substrate is referred to as being "beneath" another element, it can be directly beneath the other element or intervening elements may also be present.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Hereinafter, an exemplary embodiment of the present invention will be described in detail with reference to the accompanying drawings.

Figure 2:
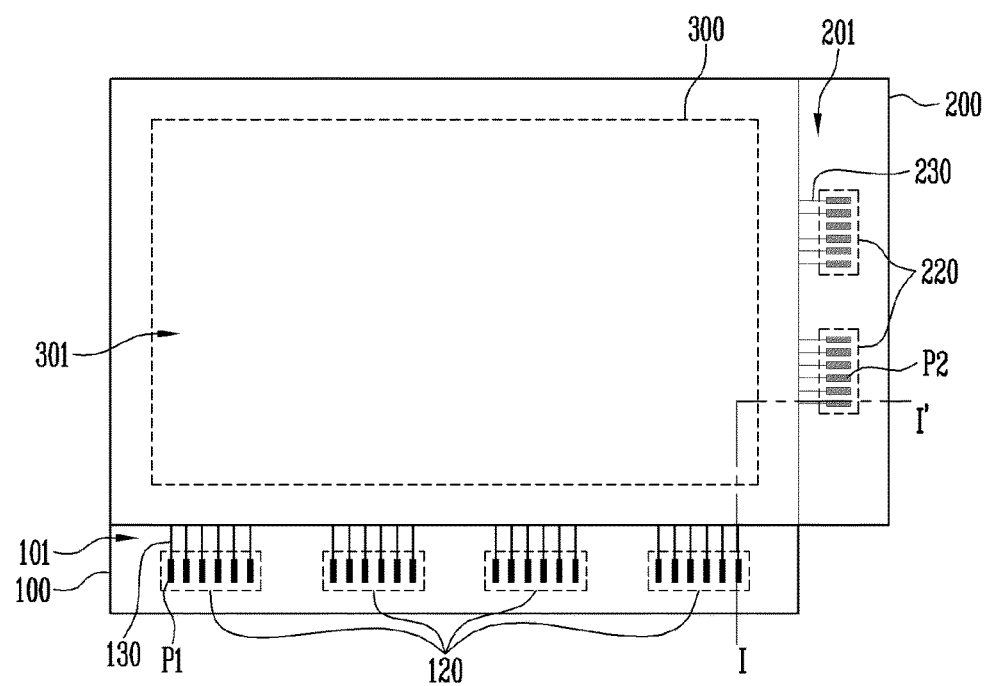
FIG. 2 is a top plan view of the display device integrated with a sensor illustrated in FIG. 1.
Figure 3:
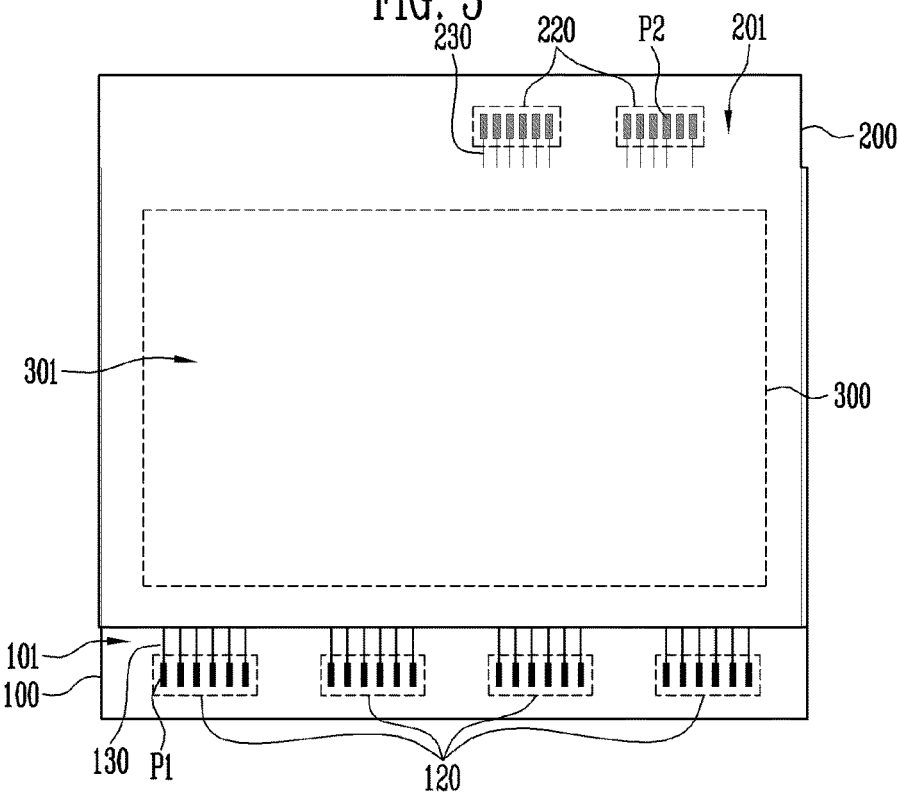
FIG. 3 is a top plan view of a display device integrated with a sensor according to an exemplary embodiment of the present invention.
Figure 4:
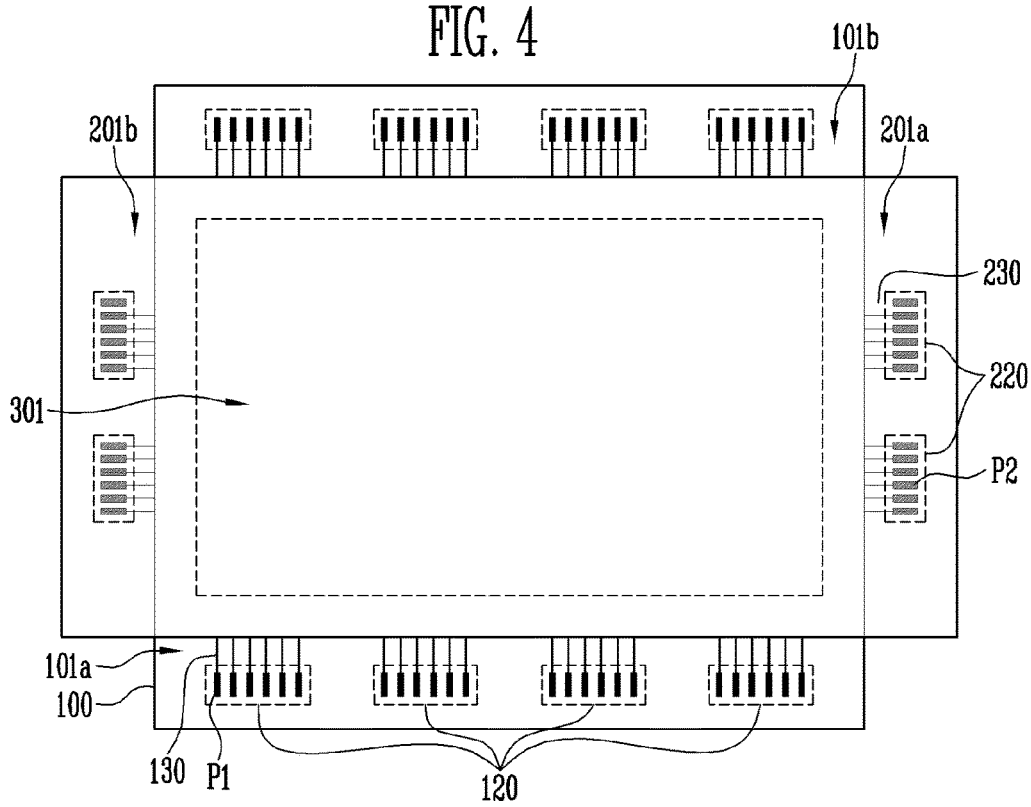
FIG. 4 is a top plan view of a display device integrated with a sensor according to an exemplary embodiment of the present invention.

FIGS. 1 and 2 are a perspective view and a top plan view of a display device integrated with a sensor according to an exemplary embodiment of the present invention. FIG. 3 is a top plan view of a display device integrated with a sensor according to an exemplary embodiment of the present invention, and FIG. 4 is a top plan view of a display device integrated with a sensor according to an exemplary embodiment of the present invention.

First, referring to FIGS. 1 and 2, a display device integrated with a sensor according to an exemplary embodiment of the present invention includes a first substrate 100 and a second substrate 200 disposed facing each other, a sealing material 300 for sealing an overlapping region between the first substrate 100 and the second substrate 200, a sealed region 301 disposed inside the sealing material 300, a display unit 110 including a plurality of pixels 112 provided in the sealing region 301, and a sensor electrode unit 210 formed on the second substrate 200.

The first substrate 100 and the second substrate 200 are disposed so that ends of the first substrate 100 and the second substrate 200 at different sides are exposed. First and second pad units 120 and 220 are formed in exposed parts 101 and 201 of the first and second substrates 100 and 200, respectively.

The first substrate 100 and the second substrate 200 may be disposed so that one or more regions of the first substrate 100 and the second substrate 200 including a region corresponding to the display unit 110 overlap each other. The first substrate 100 and the second substrate 200 may overlap each other in such a manner that the first substrate 100 may include the exposed part 101 that does not overlap the second substrate 200 and the second substrate 200 may include the exposed part 201 that does not overlap the first substrate 100.

According to exemplary embodiments of the present invention, sizes, shapes, and disposition direction of the first substrate 100 and the second substrate 200 may be different. However, exemplary embodiments of the present invention are not limited thereto. For example, the first substrate 100 and the second substrate 200 may have the same size, but may be shifted in a horizontal and/or vertical direction during disposition.

As shown in FIGS. 1 and 2, the exposed part 101 of the first substrate 100 and the exposed part 201 of the second substrate 200 are located at different sides. That is, when the first substrate 100 includes the first exposed part 101 positioned at a first side of the sealed region 301 and is provided with the first pad units 120, the second substrate 200 includes the second exposed part 201 positioned at a second side of the sealed region 301 and is provided with the second pad units 220.

For example, when the exposed part 101 of the first substrate 100 is disposed at an upper side or a lower side of the sealed region 301, the exposed part 201 of the second substrate may be disposed at a left side or a right side of the sealed region 301. That is, as shown in FIG. 2, the exposed part 101 of the first substrate 100 may be disposed at the lower side of the sealed region 301, and the exposed part 201 of the second substrate 200 may be disposed at the right side of the sealed region 301.

However, the positions of the exposed part 101 of the first substrate 100 and the exposed part 201 of the second substrate 200 are not limited thereto and may be variously changed. For example, the exposed part 101 of the first substrate 100 and the exposed part 201 of the second substrate 200 may be disposed at positions across from each other based on the sealed region 301. That is, as illustrated in FIG. 3, the exposed part 101 of the first substrate 100 and the exposed part 201 of the second substrate 200 may be disposed at positions facing each other based on the sealed region 301.

Additionally or alternatively, each of the first substrate 100 and/or the second substrate 200 may include a plurality of exposed ends.

For example, as illustrated in FIG. 4, the first substrate 100 may include a first exposed end 101a positioned at the first side of the sealed region 301 and/or a third exposed end 101b facing the first exposed end 101a based on the sealed region 301. Further, the second substrate 200 may include a second exposed end 201a positioned at the second side of the sealed region 301 and/or a fourth exposed end 201b facing the second exposed end 201a based on the sealed region 301.

However, the first and third exposed ends 101a and 101b need not be essentially disposed at the facing positions, and the second and fourth exposed ends 201a and 201b need not be essentially disposed at the facing positions. That is, the locations of the first, second, third, and/or fourth exposed ends 101a, 101b, 201a, and 201b may be variously changed.

When the first substrate 100 includes exposed ends 101a and 101b, first pad units 120 may be provided on both of the exposed ends 101a and 101b. Further, when the first substrate 100 includes only one exposed end, that is, the first or third exposed end 101a or 101b, the first pad units 120 may be distributed into groups on the exposed end.

Similarly, when the second substrate 200 includes exposed ends 201a and 201b, second pad units 220 may be provided on both of the exposed ends 201a and 201b. Further, when the second substrate 200 includes only one exposed end, that is, the second or fourth exposed end 201a or 201b, the second pad units 220 may be distributed into groups on the corresponding exposed end.

Referring back to FIGS. 1 and 2, the first pad units 120 electrically connected to the display unit 110 are formed in the exposed part 101 of the first substrate 100, and the second pad units 220 electrically connected with the sensor electrode unit 210 are formed in the exposed part 201 of the second substrate 200.

The first pad units 120 are formed on the same surface of the first substrate 100 as display unit 110. The first pad units 120 are electrically connected with the display unit 110 through at least one driving line 130. The driving line 130 may cross the sealing material 300 where the first and second substrates 100 and 200 are bonded to each other. The first pad unit 120 may include first pads P1 corresponding to the number of driving lines 130. Further, the first pad units 120 may be intensively disposed together in one region, or distributed into a plurality of groups. A driving IC for driving the display unit 110 may be directly embedded in the first pad unit 120, or the first pad unit 120 may be connected to a driving integrated circuit (IC) through a flexible printed circuit board (FPCB).

The driving lines 130 may supply a driving signal and/or driving power to the display unit 110, and the driving lines 130 may be formed between the display unit 110 and the first pad unit 120.

The second pad unit 220 may be formed on the same surface of the second substrate 200 as the sensor electrode unit 210. For example, the sensor electrode unit 210 and the second pad units 220 may be formed on one surface of the second substrate 200 facing the first substrate 100. The second pad unit 220 may include second pads P2 corresponding to the number of sensor lines 230. Further, the second pad units 220 may be intensively disposed together in one region, or distributed into a plurality of groups. A sensor IC for driving the sensor electrode unit 210 may be directly embedded in the second pad unit 220, or the second pad unit 220 may be connected to a sensor IC through a FPCB.

The sensor electrode unit 210 may be disposed within the sealed region 301. The sensor electrode unit 210 may include touch electrodes formed in the region corresponding to the display unit 110 and overlapping the pixels 112. As such, it is possible to provide touch input while decreasing the thickness of the display device integrated with a sensor.

The second pad unit 220 is formed on the exposed part 201 of the second substrate 200 positioned outside the sealed region 301. The second pad unit 220 may be electrically connected with the sensor electrode unit 210 through at least one sensor line 230 crossing the sealing material 300 where the first and second substrates 100 and 200 are bonded to each other.

The sensor line 230 may supply a driving signal to the sensor electrode unit 210 or detect a variation in capacitance generated in the sensor electrode unit 210. The sensor lines 230 may be formed between the sensor electrode unit 210 and the second pad unit 220.

According to the display device integrated with a sensor according to the exemplary embodiments of the present invention, the first and second substrates 100 and 200 are disposed such that the ends of the first and second substrates 100 and 200 are exposed at different sides. The first and second pad units 120 and 220 are formed in the exposed parts 101 and 201 of the first and second substrates 100 and 200, respectively. Accordingly, each of the first and second substrates 100 and 200 may be directly connected to a driving element, such as a driving IC or a sensor IC.

Accordingly, even when the sensor electrode unit 210 is formed on the upper substrate (that is, the second substrate 200) of the display panel, the sensor electrode unit 210 may be directly connected with a sensor IC through the second pad units 220 formed on the second substrate 200 without electrically connecting the sensor electrode unit 210 to a connection line or a sensor pad formed on the lower substrate (that is, the first substrate 100) of the display panel.

Accordingly, a process for making the first and second substrates 100 and 200 using a traditional conductive spacer and the like may be omitted. This may simplify the manufacturing process, reduce problems caused by a traditional complex manufacturing, and, therefore, may reduce manufacturing costs. Further, when the first and second pad units 120 and 220 are formed on the first and second substrates 100 and 200, respectively, exemplary embodiments of the present invention may be easily applied even to a display device having a more complicated structure.

Further the second pad unit 220 may be formed together with the sensor electrode unit 210 by using at least one material among the conductive materials forming the sensor electrode unit 210. In this case, even though the second pad units 220 are separately formed on the second substrate 200, a process of manufacture according to exemplary embodiments of the present invention may be simplified.

Figure 5:
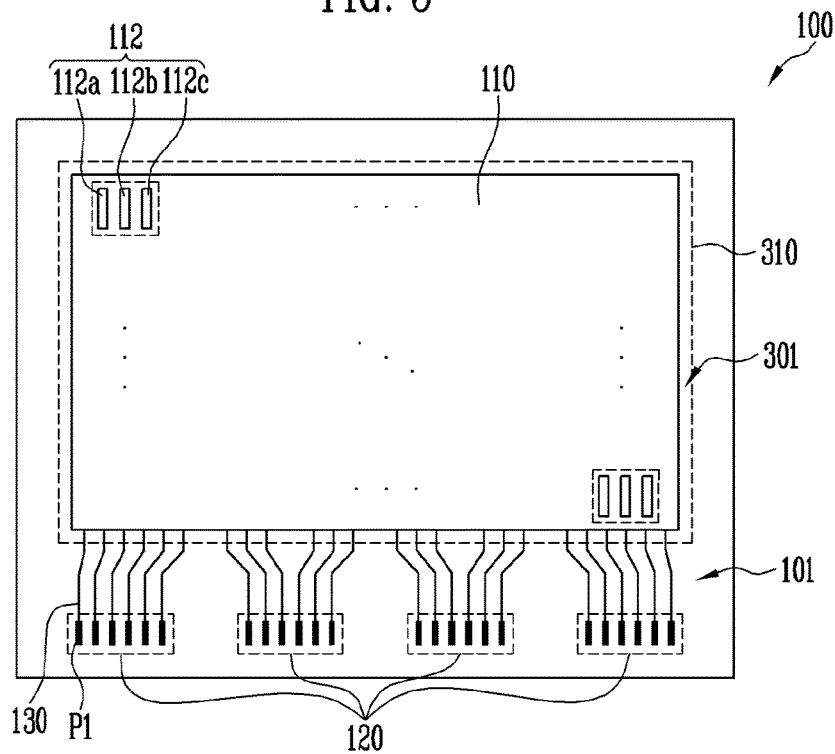
FIG. 5 is a top plan view illustrating the first substrate of FIGS. 1 and 2.
Figure 6:
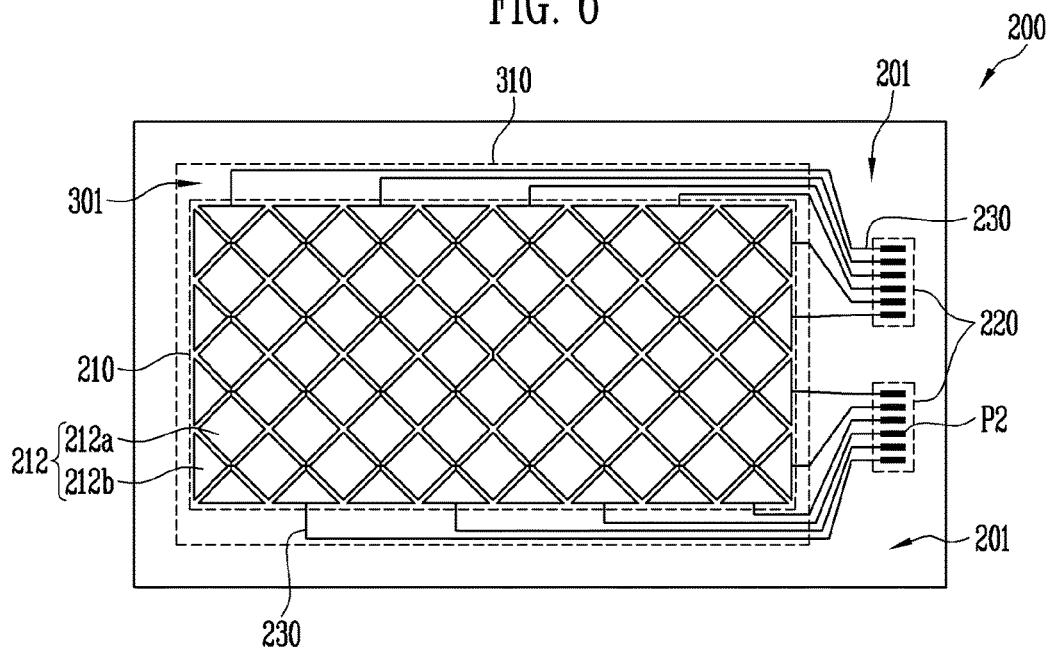
FIG. 6 is a top plan view illustrating the second substrate of FIGS. 1 and 2.
Figure 7:
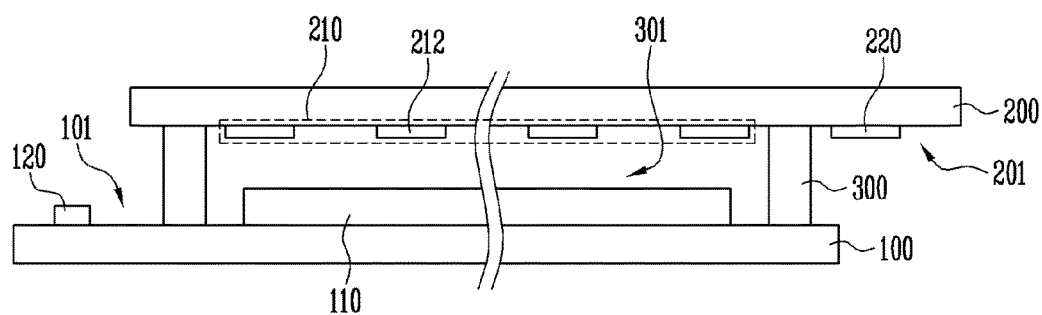
FIG. 7 is a cross-sectional view illustrating a coupling cross-section of the display device integrated with a sensor of FIGS. 1 and 2.
Figure 8:
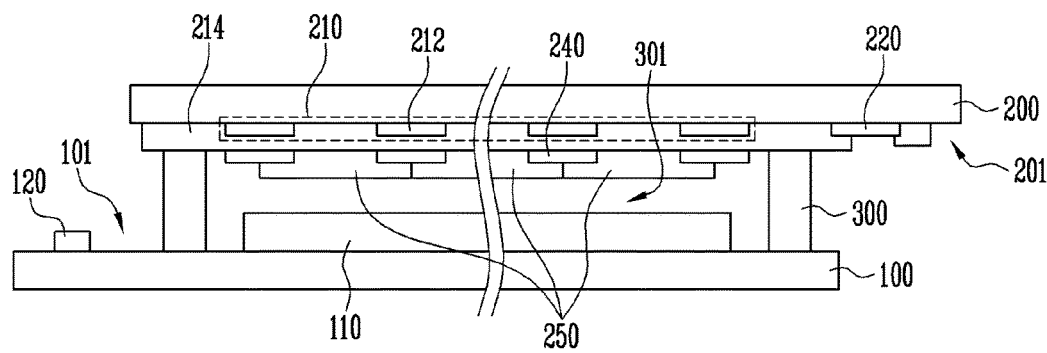
FIG. 8 is a cross-sectional view illustrating an exemplary embodiment of a coupling cross-section of the display device integrated with a sensor illustrated in FIGS. 1 and 2.

FIGS. 5 and 6 are top plan views illustrating the first substrate and the second substrate illustrated in FIGS. 1 and 2, respectively. FIG. 7 is a cross-sectional view illustrating a coupling cross-section of the display device integrated with a sensor illustrated in FIGS. 1 and 2, and FIG. 8 is a cross-sectional view illustrating a coupling cross-section of the display device integrated with a sensor illustrated in FIGS. 1 and 2. Particularly, the cross-sectional views of FIGS. 7 and 8 are the cross-sectional views taken along line I-I' of FIG. 2.

Referring to FIG. 5, the display unit 110 is disposed in the sealed region 301 of the first substrate 100. The sealed region 301 may be defined as a region inside a sealing line 310 in which the sealing material 300 of FIGS. 1 and 2 is disposed.

The display unit 110 may include, for example, pixels 112 including first, second, and third sub pixels 112a, 112b, and 112c. The pixels 112 may be, for example, pixels of an organic light emitting display device or a liquid crystal display device, or pixels of other types of display device.

When the pixels 112 are the pixels of the organic light emitting display device, an anode electrode, an emission layer, a cathode electrode, and the like of an organic light emitting diode (elements not shown) may be formed in the display unit 110. A pixel circuit for driving the organic light emitting diode (not shown) may be formed.

Further, when the pixels 112 are the pixels of the liquid crystal display device, at least one pixel electrode may be formed in the display unit 110 on the first substrate 100 and a pixel circuit for driving the pixels may be formed.

The first pad units 120 may be formed near an outer edge of the sealed region 301. The first pad units 120 may be formed on the exposed part 101 of the first substrate 100, which is the area that does not overlap the second substrate 200, as illustrated in FIGS. 1 and 2.

The first pad unit 120 is electrically connected with the display unit 110 by the driving lines 130, which are disposed to cross the sealing line 310. The sealing line 310 defines a region in which the sealing material 300 of FIGS. 1 and 2 is to be disposed.

Referring to FIG. 6, the sensor electrode unit 210 is disposed in the sealed region 301 of the second substrate 200. For example, touch electrodes 212 may be formed within the sealed region 301 on a surface of the second substrate 200 facing the first substrate 100.

The touch electrodes 212 may include first touch electrodes 212a disposed in a first direction, and second touch electrodes 212b disposed in a second direction different from the first direction. Accordingly, it is possible to detect a position at which the touch input is generated.

However, in exemplary embodiments of the present invention, it is not limited that the sensor electrode unit 210 is configured to include the touch electrodes 212. That is, the sensor electrode unit 210 may be implemented by various sensor electrodes, such as sensor electrodes of a photo sensor or a temperature sensor. Further, a position of the sensor electrode unit 210 may vary according to the type of sensor, a design intention, and the like.

The second pad units 220 are formed near an outer edge of the sealed region 301, on the exposed part 201 of the second substrate 200. The exposed part 201 of the second substrate 200 does not overlap the first substrate 100, as illustrated in FIGS. 1 and 2.

The second pad unit 220 is electrically connected with the sensor electrode unit 210 by the sensor lines 230, which cross the sealing line 310. Sealing line 310 defines a portion in which the sealing material 300 of FIGS. 1 and 2 is to be disposed.

First substrate 100 and second substrate 200 may be bonded such that the display unit 110 and the sensor electrode unit 210 face each other and are sealed by the sealing material 300 as illustrated in FIG. 7.

First and second substrates 100 and 200 are sealed by laser irradiation of the sealing material 300. During this process, sealing material 300 may partially overlap the driving lines 130 and/or the sensor lines 230 as illustrated in FIGS. 1 through 6. In this case, when laser irradiation occurs in both directions crossing the first and second substrates 100 and 200, a space between the first and second substrates 100 and 200 may be sealed. In an exemplary embodiment of the present invention, the sealing material 300 may be formed on both of the first substrate 100 and the second substrate 200, and a laser may irradiate both of the first and second substrates 100 and 200.

When the first substrate 100 and the second substrate 200 are sealed, the display unit 110 and the sensor electrode unit 210 are disposed within the sealed region 301. The first pad units 120 for driving the display unit 110 and the second pad units 220 for driving the sensor electrode unit 210 are disposed on the exposed parts 101 and 201 of the first and second substrates 100 and 200, respectively, and exposed outside the sealed region 301.

Further, the first and second pad units 120 and 220 are connected to the driving element, such as the driving IC and the sensor IC, so that it is possible to drive the display device integrated with a sensor even without a process of electrically connecting the first and second substrates 100 and 200 to each other.

A common electrode, a black matrix, and/or a color filer may be further included within the sealed region 301 of the second substrate 200 according to the type of display panel, or other considerations.

For example, as illustrated in FIG. 8, the second substrate 200 may further include an insulation layer 214, a black matrix 240, and/or a color filter 250 formed between the sensor electrode unit 210 and the display unit 110.

According to an exemplary embodiment of the present invention, the sensor electrode unit 210, and/or the black matrix 240 and the second pad unit 220 may be simultaneously formed by forming the second pad unit 220 by using at least one material among the conductive materials forming the sensor electrode unit 210 and/or the black matrix 240. However, even though the second pad unit 220 is separately formed on the second substrate 200, the present invention may simplify the fabricating process in its entirety.

An exemplary embodiment of the present invention discloses a general display device integrated with a sensor, a pad unit of a display panel is formed on a lower substrate which includes a driving element for driving pixels and driving lines.

Accordingly, when a sensor electrode unit is formed on an upper substrate of the display panel, a process of electrically connecting the sensor electrode unit to connection lines or the pad unit on the lower substrate is performed.

According to the display device integrated with a sensor according to the exemplary embodiments of the present invention, the first and second substrates 100 and 200 configuring the display panel are disposed so that the exposed ends 101 and 202 are at different sides. The first and second pad units 120 and 220 are formed in the exposed parts 101 and 201 of the first and second substrates.

Accordingly, it is possible to provide the display device integrated with a sensor with a decreased thickness by forming the sensor electrode unit 210, including the touch electrodes 212, on the upper substrate 200 of the display panel, but omit a process of electrically connecting the upper and lower substrates 100 and 200. This may reduce problems cause during manufacture and decrease manufacturing costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device integrated with a sensor, comprising: a first substrate; a second substrate facing the first substrate; a display unit comprising pixels disposed between the first substrate and the second substrate in a sealed region surrounded by a sealing material; a sensor electrode unit disposed on the second substrate, the sensor electrode unit comprising first touch electrodes arranged in a first direction and second touch electrodes arranged in a second direction crossing the first direction; a first pad unit coupled to the display unit; and a second pad unit coupled to the sensor electrode unit, the second pad unit comprising second pads disposed together on a side of the second substrate and coupled to the first and second touch electrodes, wherein: the first substrate has a first exposed end that does not overlap the second substrate, the second substrate has a second exposed end that does not overlap the first substrate, the first pad unit is disposed on the first exposed end, and the second pad unit is disposed on the second exposed end; the first exposed end and the second exposed end are disposed in an opposite direction to each other with the sealed region therebetween without overlapping with the sealed region; and the sensor electrode unit is connected to a sensor integrated circuit (IC) through the second pads without passing through a pad formed on the first substrate, wherein each of the second pads comprises at least one conductive material among the conductive materials that forms the sensor electrode unit and a black matrix disposed on the second substrate.

2. The display device integrated with a sensor of claim 1, wherein the sensor electrode unit and the second pad unit are disposed on a same surface facing the first substrate.

3. The display device integrated with a sensor of claim 2, wherein the sensor electrode unit is disposed in the sealed region, and
wherein the second pad unit is coupled to the sensor electrode unit by at least one sensor line disposed at least partially in the sealed region.

4. The display device integrated with a sensor of claim 1, wherein the first touch electrodes and the second touch electrodes overlap the pixels.

5. The display device integrated with a sensor of claim 1, wherein the display unit and the first pad unit are disposed on a same surface of the first substrate, and
wherein the first pad unit is coupled to the display unit by at least one driving line disposed at least partially in the sealed region.

6. The display device integrated with a sensor of claim 1, wherein the first substrate and the second substrate differ in at least one of a size, a shape, and a disposition direction.

7. A method for manufacturing a display device integrated with a sensor, comprising: disposing a first substrate and a second substrate to face each other; arranging the first substrate and the second substrate to have a first exposed end and a second exposed end, respectively, such that the first exposed end does not overlap the second substrate and the second exposed end does not overlap the first substrate; disposing a display unit comprising pixels between the first substrate and the second substrate in a sealed region surrounded by a sealing material; and irradiating the sealing material, wherein: a sensor electrode unit comprising first touch electrodes arranged in a first direction and second touch electrodes arranged in a second direction crossing the first direction is disposed on the second substrate; at least one first pad unit coupled to the display unit is disposed on the first exposed end; at least one second pad unit coupled to the sensor electrode unit is disposed on the second exposed end, the second pad unit comprising second pads disposed together on a side of the second substrate and coupled to the first and second touch electrodes; the first exposed end and the second exposed end are disposed in an opposite direction to each other with the sealed region therebetween without overlapping with the sealed region, and the sensor electrode unit is connected to a sensor integrated circuit (IC) through the second pads without passing through a pad formed on the first substrate, wherein the at least one second pad unit comprises at least one conductive material among the conductive materials that forms the sensor electrode unit and a black matrix disposed on the second substrate.

8. The method of claim 7, wherein the first substrate and the second substrate differ in at least one of a size, a shape, and a disposition direction.

9. The method of claim 7, wherein the at least one second pad unit is formed at the same time as at least one of the sensor electrode unit and the black matrix.

\* \* \* \* \*